(12) United States Patent
Gong et al.

(10) Patent No.: US 12,212,323 B2
(45) Date of Patent: Jan. 28, 2025

(54) LATCH, PROCESSOR INCLUDING LATCH, AND COMPUTING APPARATUS

(71) Applicant: SHENZHEN MICROBT ELECTRONICS TECHNOLOGY CO., LTD., Guangdong (CN)

(72) Inventors: Chuan Gong, Guangdong (CN); Wenbo Tian, Guangdong (CN); Zhijun Fan, Guangdong (CN); Zuoxing Yang, Guangdong (CN); Haifeng Guo, Guangdong (CN)

(73) Assignee: SHENZHEN MICROBT ELECTRONICS TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 18/266,805

(22) PCT Filed: Mar. 9, 2023

(86) PCT No.: PCT/CN2023/080425
§ 371 (c)(1),
(2) Date: Jun. 12, 2023

(87) PCT Pub. No.: WO2023/207351
PCT Pub. Date: Nov. 2, 2023

(65) Prior Publication Data
US 2024/0396534 A1 Nov. 28, 2024

(30) Foreign Application Priority Data
Apr. 28, 2022 (CN) .......................... 202210455757.4

(51) Int. Cl.
*H03K 3/037* (2006.01)
*H03K 3/012* (2006.01)
(Continued)

(52) U.S. Cl.
CPC ....... *H03K 3/037* (2013.01); *H03K 3/356173* (2013.01); *H03K 19/0016* (2013.01); *H03K 19/01728* (2013.01); *H03K 3/012* (2013.01)

(58) Field of Classification Search
CPC ........ H03K 3/037; H03K 3/353; H03K 3/356; H03K 3/356173; H03K 19/0008; H03K 19/0016; H03K 19/017; H03K 19/01728
See application file for complete search history.

(56) References Cited

U.S. PATENT DOCUMENTS 5,463,340 A * 10/1995 Takabatake ...... H03K 3/356156
377/79
5,576,651 A 11/1996 Phillips
(Continued)

FOREIGN PATENT DOCUMENTS

CN 202713250 U 1/2013
CN 104079290 A 10/2014
(Continued)

OTHER PUBLICATIONS

Second TW Office Action with Search Report dated May 29, 2024 for TW Application No. 112108657 (22 pages including English Translation).
(Continued)

*Primary Examiner* — Jason M Crawford
(74) *Attorney, Agent, or Firm* — Merchant & Gould P.C.

(57) ABSTRACT

The present disclosure relates to a latch, a processor including the latch, and a computing apparatus. A latch with an inverted output is provided, including: an input stage configured to receive a latch input; an output stage configured to output a latch output; an intermediate node disposed between an output of the input stage and an input of the output stage, wherein the output stage is configured to receive a signal at the intermediate node as an input; and a feedback stage configured to receive the latch output and
(Continued)

provide a feedback to the intermediate node, wherein feedback stage assumes a logic-high state, a logic-low state, and a high-impedance state, wherein the latch output is inverted from the latch input.

13 Claims, 8 Drawing Sheets

(51) Int. Cl.
  *H03K 3/356* (2006.01)
  *H03K 19/00* (2006.01)
  *H03K 19/017* (2006.01)

(56) References Cited

U.S. PATENT DOCUMENTS

| | | | | |
|---|---|---|---|---|
| 5,629,643 | A * | 5/1997 | Moughanni | H03K 3/356 121 327/199 |
| 6,605,971 | B1 * | 8/2003 | Burr | H03K 3/356 165 327/214 |
| 9,148,149 | B2 * | 9/2015 | Cheng | H03K 19/09429 |
| 10,355,671 | B1 * | 7/2019 | Mao | H03K 3/35625 |
| 10,659,017 | B1 * | 5/2020 | Rengarajan | H03K 3/0372 |
| 10,840,892 | B1 | 11/2020 | Rengarajan et al. | |
| 10,992,289 | B2 * | 4/2021 | Wu | H03K 3/35625 |
| 11,863,188 | B2 * | 1/2024 | Kang | H03K 3/35625 |
| 12,009,817 | B2 * | 6/2024 | Ioki | H03K 19/0948 |
| 2004/0135611 | A1 | 7/2004 | Tohsche | |
| 2014/0285236 | A1 * | 9/2014 | Cheng | H03K 19/09429 326/58 |
| 2015/0200651 | A1 * | 7/2015 | Baratam | H03K 3/012 327/202 |
| 2015/0381154 | A1 * | 12/2015 | Maeno | H03K 3/35625 327/203 |
| 2019/0372557 | A1 | 12/2019 | Mao | |
| 2020/0143851 | A1 * | 5/2020 | Holm | G11C 7/106 |
| 2021/0184659 | A1 * | 6/2021 | Subbannavar | H03K 3/35625 |
| 2023/0396241 | A1 * | 12/2023 | Kim | H03K 3/012 |
| 2024/0364316 | A1 * | 10/2024 | Tian | H03K 3/012 |

FOREIGN PATENT DOCUMENTS

| | | |
|---|---|---|
| CN | 105391430 A | 3/2016 |
| CN | 110635783 A | 12/2019 |
| CN | 213879787 U | 8/2021 |
| CN | 114567293 A | 5/2022 |
| JP | 2011023941 A | 2/2011 |
| KR | 10-2021-0039337 A | 4/2021 |
| TW | 202119759 A | 5/2021 |

OTHER PUBLICATIONS

Notification to grant patent right issued on Jun. 30, 2023 for corresponding CN Application No. 202210455757.4 (8 pages including English Translation).
International Search Report for PCT/CN2023/080425 dated Apr. 23, 2023 (7 pages which includes English Machine Translation).
Written Opinion of the International Searching Authority for PCT/CN2023/080425 dated Apr. 23, 2023 (8 pages which Includes English Machine Translation).
Notification of Transmittal of the International Search Report and Written Opinion (Form PCT/ISA/220) for PCT/CN2023/080425 dated Apr. 23, 2023 (1 page).
First Office Action issued for CN Application No. 202210455757.4 dated Jun. 10, 2022 (17 pages including English machine translation.
Second Office Action issued for CN Application No. 202210455757.4 dated Jul. 7, 2022 (16 pages including English machine translation.
Third Office Action issued for CN Application No. 202210455757.4 dated Jul. 19, 2022 (14 pages including English machine translation.
Rejection Decision for CN Application No. 202210455757.4 dated Jan. 3, 2023 (15 pages including English machine translation.
Reexamination Decision for CN Application No. 202210455757.4 dated Mar. 8, 2023 (2 pages including English machine translation.
First Office Action dated Sep. 12, 2024 for corresponding KR Application No. 10-2023-7020697 (27 pages including English Translation).

* cited by examiner

LATCH, PROCESSOR INCLUDING LATCH, AND COMPUTING APPARATUS

CROSS-REFERENCE TO RELATED APPLICATIONS

This application is a National Stage Application of International Application No. PCT/CN2023/080425, filed 9-3-2023, which claims benefit of Ser. No. 20/221,0455757.4, filed 28-4-2022 in China, and which applications are incorporated herein by reference. To the extent appropriate, a claim of priority is made to each of the above disclosed applications.

TECHNICAL FIELD

The present disclosure relates to a latch, a processor including the latch, and a computing apparatus.

BACKGROUND

As high-performance computing has been widely applied to social fields such as exploration, climate change, transportation, artificial intelligence, and digital currency, higher requirements are imposed on the power consumption, operational speed, and area (cost) of high-performance computing chips. In recent years, digital currency has attracted more and more attention. In a related art, a processor and a computing apparatus for digital currency need to be improved.

The processor for digital currency needs to perform a large amount of repetitive logical calculations during operation, requiring a large number of latches for data storage. Therefore, the performance of the latches directly affects the performance of the processor, including the chip's area, power consumption, operational speed, etc.

SUMMARY

According to an aspect of the present disclosure, a latch with an inverted output is provided, comprising: an input stage configured to receive a latch input; an output stage configured to output a latch output; an intermediate node disposed between an output of the input stage and an input of the output stage, wherein the output stage is configured to receive a signal at the intermediate node as an input; and a feedback stage configured to receive the latch output and provide a feedback to the intermediate node, wherein the feedback stage assumes a logic-high state, a logic-low state, and a high-impedance state, wherein the latch output is inverted from the latch input.

In some embodiments, the feedback stage comprises a tri-state gate that comprises: first to fourth transistors that are sequentially connected in series, wherein the first transistor and the second transistor are transistors of a first conductivity type, the third transistor and the fourth transistor are transistors of a second conductivity type that is different from the first conductivity type, a control terminal of one of the first transistor and the second transistor is configured to be connected to the latch output, a control terminal of the other of the first transistor and the second transistor is configured to be connected to a first clock signal, a control terminal of one of the third transistor and the fourth transistor is configured to be connected to the latch output, a control terminal of the other of the third transistor and the fourth transistor is configured to be connected to a second clock signal, wherein the second clock signal is an inverse of the first clock signal, a node at which the second transistor and the third transistor are connected with each other is configured to be connected to the intermediate node.

In some embodiments, the feedback stage comprises an inverter and a transmission gate connected in series, the inverter comprises a first transistor of a first conductivity type and a fourth transistor of a second conductivity type that are connected in series, the transmission gate comprises a second transistor of the first conductivity type and a third transistor of the second conductivity type that are connected in parallel, the second conductivity type is different from the first conductivity type, an input of the inverter is configured to be connected to the latch output, an output of the inverter is configured to be connected to an input of the transmission gate, an output of the transmission gate is configured to be connected to the intermediate node, two control terminals of the transmission gate are configured to receive a first clock signal and a second clock signal respectively, wherein the second clock signal is an inverse of the first clock signal.

In some embodiments, the input stage is a transmission gate, one end of which is configured to receive the latch input, another end of which is configured to be connected to the intermediate node, and control terminals of which are configured to receive a first clock signal and a second clock signal respectively.

In some embodiments, the first conductivity type is P-type, and the second conductivity type is N-type, when the first clock signal is high and the second clock signal is low, the feedback stage is configured to be turned off to assume a high-impedance state; when the first clock signal is low and the second clock signal is high, the feedback stage is configured to provide a feedback to the intermediate node based on the latch output.

In some embodiments, the output stage is an inverter.

In some embodiments, one end of the transmission gate is configured to receive the latch input, and another end of the transmission gate is configured to be connected to the intermediate node, the input stage is the transmission gate that comprises a fifth transistor of the first conductivity type and a sixth transistor of the second conductivity type that are connected in parallel, a gate of the fifth transistor is configured to receive the second clock signal, and a gate of the sixth transistor is configured to receive the first clock signal.

In some embodiments, the transistors of the first conductivity type are PMOS (P-type Metal Oxide Semiconductor) transistors, and the transistors of the second conductivity type are NMOS (N-type Metal Oxide Semiconductor) transistors.

In some embodiments, thresholds of transistors in the latch are basically identical.

According to an aspect of the present disclosure, a processor is provided, comprising: at least one latch, wherein the latch is the latch according to any one of the embodiments of the present disclosure.

In some embodiments, the at least one latch comprises a plurality of latches; and the processor further comprises: a clock circuit configured to provide a desired clock signal to each of the plurality of latches.

In some embodiments, the clock circuit comprises a first inverter and a second inverter connected in series, the first inverter is configured to receive a clock signal and output a first clock signal, and the second inverter is configured to receive the first clock signal and output a second clock signal, the first clock signal and the second clock signal are provided to each of the plurality of latches.

According to an aspect of the present disclosure, a computing apparatus is provided, comprising the processor according to any one of the embodiments of the present disclosure.

In some embodiments, the computing apparatus is a computing apparatus for digital currency.

Other features and advantages of the present disclosure will become apparent from the following detailed description of exemplary embodiments of the present disclosure with reference to the accompanying drawings.

BRIEF DESCRIPTION OF DRAWINGS

The drawings as a part of the specification illustrate embodiments of the present disclosure and are used together with the specification to interpret the principles of the present disclosure.

The present disclosure can be more clearly understood from the following detailed description with reference to the drawings, in which.

Figure 1:
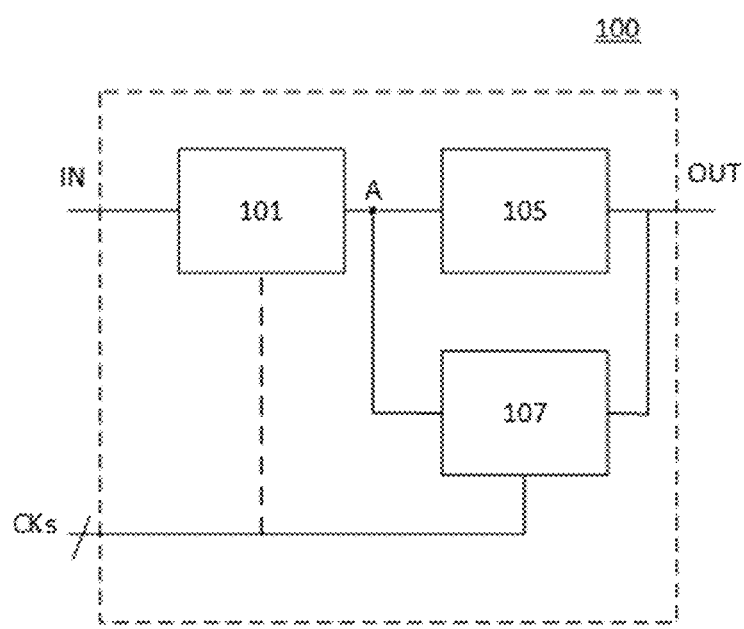
FIG. 1 shows a schematic block diagram of a latch according to some embodiments of the present disclosure.

It is hereby noted that in the embodiments described below, the same reference numerals are sometimes used between different drawings to denote the same parts or the parts of the same functions, and repeated description thereof is omitted. In this specification, similar reference numerals and letters are used to represent similar items. Therefore, once an item is defined in one drawing, the item does not need to be further discussed in subsequent drawings.

For ease of understanding, the position, dimensions, range, and the like of each structure shown in the drawings sometimes do not represent the actual position, dimensions, range, and the like. Therefore, the disclosed invention is not limited to the positions, dimensions, ranges, and the like disclosed in the drawings and the like.

DETAILED DESCRIPTION

Various exemplary embodiments of the present disclosure will now be described in detail with reference to the drawings. It is hereby noted that, unless otherwise specifically specified, the relative arrangement of parts and steps, numerical expressions, and numerical values set forth in these embodiments do not limit the scope of the present disclosure. In addition, the technologies, methods, and devices known to a person of ordinary skill in the related art may be described without going into details, but as appropriate, such technologies, methods, and devices are regarded as a part of the granted specification.

It should be understood that the following description of at least one exemplary embodiment is merely illustrative, and is in no way intended as a limitation on the present disclosure and the application or the use thereof. Further, it should also be understood that any implementation described exemplarily herein is not necessarily meant to be preferred or advantageous over other implementations. The present disclosure is not limited by any expressly stated or implied theory described in the preceding technical field, background, summary, or detailed description.

In this specification, "tri-state logic" means a logic circuit of which an output assumes three states: a logic-high state, a logic-low state, and a high-impedance state, depending on the input and the control signal. The control signal may be, for example, a clock signal.

In this specification, "tri-state gate" means a "minimum-level" logic gate (or referred to as a logic gate circuit) of which an output can implement the three states (logic-high state, logic-low state, and high-impedance state). The "minimum-level logic gate" herein means no independent logic gate or logic unit as a part of the logic gate (tri-state gate) can be separated therefrom.

In addition, for reference purposes only, some terms may be used in the following description without being hereby intended as a limitation. For example, unless otherwise expressly specified in the context, the terms "first", "second", and other such numerical terms referring to structures or elements do not imply a sequence or order.

It should also be understood that the terms "include" and "comprise" when used herein mean existence of the feature, entirety, step, operation, unit and/or component indicated, but do not preclude the existence or addition of one or more other features, entireties, steps, operations, units, and/or components, and/or combinations thereof.

Compared with a static latch, a dynamic latch removes a positive feedback circuit used to maintain the working state, and thus has a significantly simplified circuit structure, thereby not only reducing the area of the chip, but also reducing the power consumption of the chip. However, because there is a node that has a floating potential part of the time in the dynamic latch, a parasitic capacitor at the node needs to maintain a correct voltage state during such period of time.

Figure 9:
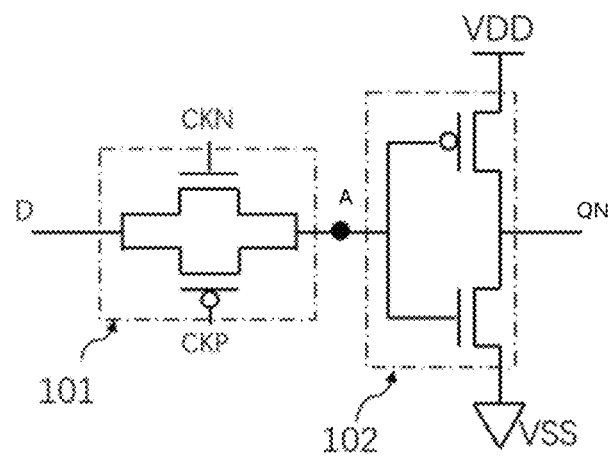
FIG. 9 shows a schematic circuit diagram of a dynamic latch according to the related art.
Figure 10:
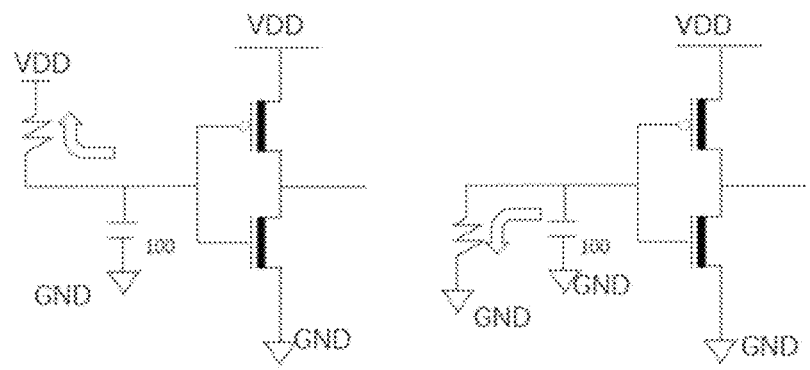
FIG. 10 shows a schematic equivalent circuit diagram used for illustrating operations of a dynamic latch in the related art.

FIG. 9 shows a circuit diagram of a dynamic latch according to the related art. FIG. 10 shows a schematic equivalent circuit diagram used for illustrating operations of the dynamic latch in the related art. The dynamic latch includes a transmission gate 101 and an inverter 102 that are connected in series between an input terminal D and an output terminal QN. A node A is formed between the transmission gate 101 and the inverter 102, and data is temporarily stored on the node A and/or the node QN through a parasitic capacitor of the inverter 102. However, the node A and the node QN generates dynamic current leakage, resulting in loss of the temporarily stored data.

Referring to FIG. 9 and FIG. 10, when CLKP is at a low level and CLKN is at a high level (denoted as CKP and CKN respectively in FIG. 9), the transmission gate 101 is turned on to transmit data to the node A, so that the data is written into the parasitic capacitor 100 of the node A. When CLKP becomes a high level and CLKN becomes a low level, the transmission gate 101 is turned off, and the data transmitted by the transmission gate is held in the parasitic capacitor 100 of the node A. When the data stored at the node A is "0" and the data at the input terminal D is "1", a pull-up leakage path (left part in FIG. 10) is formed through the transmission gate 101 to charge the parasitic capacitor 100. When the clock frequency is relatively low, that is, when a time period in which CKP=1 and CLKN=0 is long enough, the voltage of the node A will change from "0" to "1", resulting in data loss. When the data stored at the node A is "1" and the data at the input terminal D is "0", a pull-down leakage path (right part in FIG. 10) is formed through the transmission gate 101 to discharge the parasitic capacitor 100. When the clock frequency is relatively low, that is, when a time period in which CKP=1 and CLKN=0 is long enough, the voltage of the node A will change from "1" to "0", resulting in data loss.

Assuming that an amount of charges stored on the parasitic capacitor 100 is Q, a capacitance value of the parasitic capacitor 100 is C, and a voltage across electrode plates of the parasitic capacitor is V, then $Q=C\times V$.

If a leakage current is $I_{leakage}$, a leakage time T is $T=Q/I_{leakage}=C\times V/I_{leakage}$, the leakage time is proportional to a clock cycle, then $$\text{clock frequency} F_{clk} \propto 1/T = I_{leakage}/(C\times V).$$

Therefore, dynamic current leakage limits a minimum working frequency of an existing dynamic latch.

On the other hand, in order to reduce or avoid the impact caused by device current leakage to the voltage of the node, a circuit device connected to the node needs to be a low-current-leakage device. The low-current-leakage device is usually a high-threshold device, and is of a lower speed than a low-threshold device, thereby also influencing the speed of the latch. In addition, the latch needs to work at a relatively high frequency to prevent malfunction. In some states (for example, sleep or idle state) of a processor, the latch may work at a relatively low frequency, in which case the latch in the related art may incur malfunction.

To solve one or more of the problems described above, the present disclosure provides a semi-static latch, a processor including the latch, and a computing apparatus.

In contrast to the dynamic latch, the semi-static latch according to the present disclosure has a feedback stage added therein, and thus can work at a relatively low working frequency without being limited by the minimum frequency. In addition, the speed of the latch may be increased by using some low-threshold devices.

The latch according to embodiments of the present disclosure can stably maintain the potential of the floating node, and reduce power consumption of the latch. The latch according to embodiments of the present disclosure can work both at a relatively low frequency and at a relatively high frequency, thereby providing flexibility for design of a processor and reducing power consumption.

The processor and computing apparatus according to the present disclosure are applicable to related calculations of digital currency (for example, Bitcoin, Litecoin, Ethereum, and other digital currencies).

FIG. 1 shows a schematic block diagram of a semi-static latch according to some embodiments of the present disclosure. As shown in FIG. 1, a latch 100 according to an embodiment of the present disclosure includes an input stage 101 configured to receive an input (IN), and an output stage 105 configured to output a latch output (OUT).

The latch 100 also has an intermediate node (A) disposed between an output of the input stage and an input of the output stage. During operation, the potential of the intermediate node A may be floating in a part of a clock cycle.

In the embodiment shown in FIG. 1, the intermediate node A may be connected to the output of the input stage, and the input of the output stage 105 may be connected to the intermediate node A.

The latch 100 further includes a feedback stage 107 configured to receive the latch output OUT and provide a feedback to the intermediate node A. According to an embodiment of the present disclosure, the feedback stage 107 assumes a logic-high state, a logic-low state, and a high-impedance state.

In addition, one or more of components of the latch 100 may receive corresponding clock signals. As shown in FIG. 1, the input stage 101, an optional intermediate stage (if any), the feedback stage 107, and the like each receive a corresponding clock. Here, it should be understood that the clock CKs is merely exemplary and does not mean that the input stage 101, the feedback stage 107, and other components (if any) all receive the same clock signal. Further, although in the embodiment shown in FIG. 1, the output stage 105 shown does not receive the clock signal, the present disclosure is not limited to this.

Figure 2A:
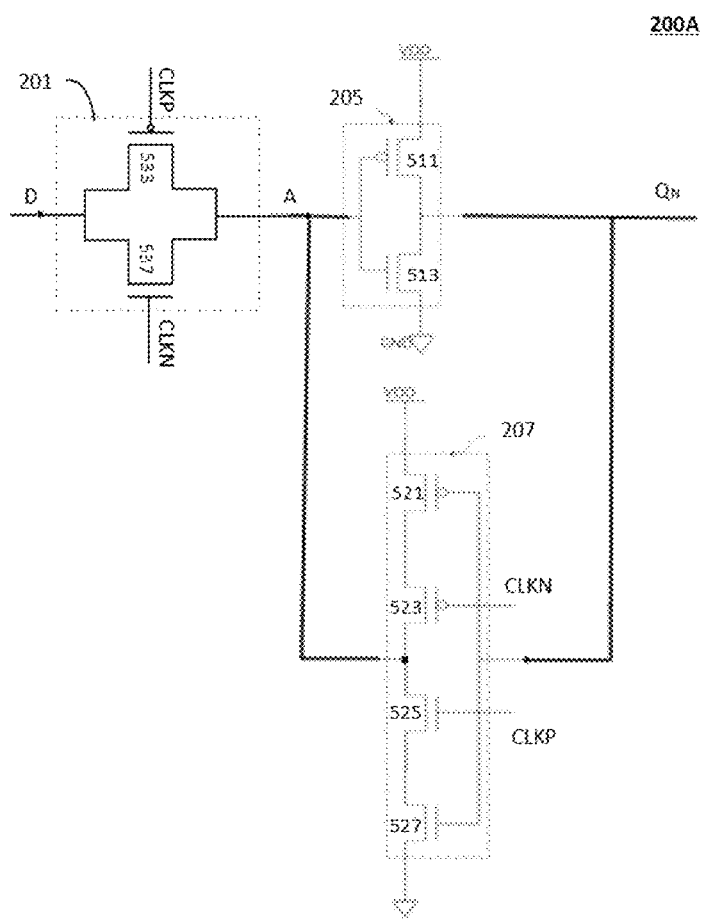
FIG. 2A shows a circuit diagram of a latch according to some embodiments of the present disclosure.

FIG. 2A shows a circuit diagram of a semi-static latch according to some embodiments of the present disclosure. As shown in FIG. 2A, a latch 200A according to an embodiment of the present disclosure includes an input stage 201, an output stage 205, an intermediate node A, and a feedback stage 207. The intermediate node A is disposed between an output of the input stage and an input of the output stage. During operation, the potential at the intermediate node A may be floating in a part of a frequency cycle.

The input stage 201 receives an input D and provides an output to the intermediate node A. Here, the input stage 201 receives an input D (also referred to as a latch input) and provides an output to the intermediate node A. In some embodiments, as shown in FIG. 2A, the input stage 201 is implemented as a transmission gate. As shown in FIG. 2A, CMOS (Complementary Metal Oxide Semiconductor) transistors 533 and 537 constitute the transmission gate, the input of which is connected to the latch input and the output of which is connected to the intermediate node A. Two control terminals of the transmission gate (that is, the gates of the CMOS transistors 533 and 537) receive the clock signal CLKP and the clock signal CLKN respectively. The clock signal CLKN and the clock signal CLKP are inverted from each other, i.e., the clock signal CLKN and the clock signal CLKP are the inverse of each other. Here, the gate of the transistor 533 is connected to the clock signal CLKP, and the gate of the transistor 537 is connected to the clock signal CLKN.

The output stage 205 receives the signal (voltage) at the node A as an input, and the output of the output stage serves as a latch output QN. In this embodiment, the output stage is implemented as an inverter that includes CMOS transistors 511 and 513 connected with each other in series. The transistor 511 is a PMOS transistor, and the transistor 513 is an NMOS transistor. The transistor 511 has a control terminal (a gate) connected to the node A, a source connected to a power supply voltage VDD, and a drain connected to a drain of the transistor 513 and connected to the output $Q_N$. The transistor 513 has a gate connected to the node A, and a source connected to a low potential (for example, a ground GND). In this specification, depending on the context, "output $Q_N$" may denote an output signal or an output terminal. Similarly, "input D" may denote an input signal or an input terminal.

In this embodiment, because the input stage 201 is a transmission gate and the output stage 205 is an inverter, the output $Q_N$ is inverted from the input D. Therefore, the latch 200A may also be referred to as an inverting latch.

The feedback stage 207 receives the latch output $Q_N$ as an input, and provides a feedback to the intermediate node A. Here, the feedback stage 207 is implemented as a tri-state logic. In the embodiment shown in FIG. 2A, the feedback stage 207 is implemented as a tri-state gate that assumes a logic-high state, a logic-low state, and a high-impedance state.

Specifically, as shown in FIG. 2A, the tri-state gate of the feedback stage 207 is implemented by CMOS transistors. The tri-state gate includes: transistors 521 to 527 that are sequentially connected in series. The transistors 521, 523, 525, and 527 are herein referred to as first to fourth transistors respectively. The first transistor 521 and the second transistor 523 are PMOS transistors, and the third transistor 525 and the fourth transistor 527 are NMOS transistors.

The first transistor 521 and the second transistor 523 are connected with each other in series. One end (here, a drain) of the transistor 521 is connected to one end (here, a source) of the transistor 523. A control terminal (a gate) of one of the first transistor 521 and the second transistor 523 is connected to the latch output $Q_N$, and a control terminal of the other of the first transistor 521 and the second transistor 523 is connected to the clock signal CLKN. Here, in the embodiment shown in FIG. 2A, the gate of the first transistor 521 is connected to the latch output $Q_N$, and the gate of the second transistor 523 is connected to the clock signal CLKN. The other end (here, a source) of the transistor 521 is connected to the power supply voltage VDD.

The drain of the PMOS transistor 523 and the drain of the NMOS transistor 525 are connected to each other and connected to the intermediate node A. The third transistor 525 and the fourth transistor 527 are connected with each other in series. One end (here, a source) of the transistor 525 is connected to one end (here, a drain) of the transistor 527. A control terminal (a gate) of one of the third transistor 525 and the fourth transistor 527 is connected to the latch output $Q_N$, and a control terminal (a gate) of the other of the third transistor 525 and the fourth transistor 527 is connected to the clock signal CLKP. The clock signal CLKN is the inverse of the clock signal CLKP. Here, in the embodiment shown in FIG. 2A, the gate of the third transistor 525 is connected to the clock signal CLKP, and the gate of the fourth transistor 527 is connected to the latch output $Q_N$. The other end (here, a source) of the transistor 527 is connected to the ground GND.

A node at which the second transistor 523 and the third transistor 525 are connected with each other is connected to the intermediate node A. Here, the drain of the transistor 523 is connected to the drain of the transistor 525, and connected to the intermediate node A.

it shall be understood that, although in the embodiment shown in FIG. 2A, the feedback stage 207 is implemented as a tri-state gate, the feedback stage 207 may be implemented in a variety of other ways in other embodiments.

Figure 7:
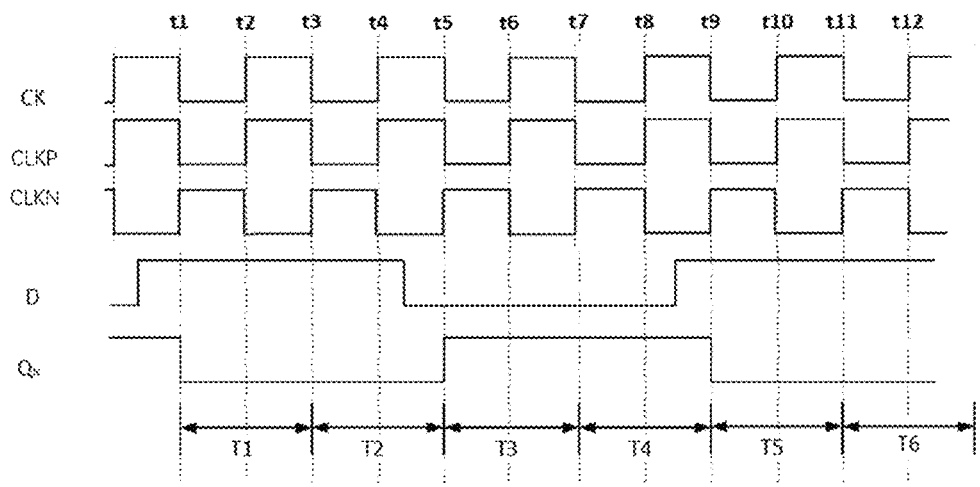
FIG. 7 shows a timing diagram of a schematic signal waveform of a latch according to some embodiments of the present disclosure.

The timing of the latch according to an embodiment of the present disclosure will be described below with reference to FIG. 7 and FIG. 2A. FIG. 7 shows a timing diagram of a schematic signal waveform of a latch according to an embodiment of the present disclosure. The clock signals CLKN and CLKP may be obtained from a clock signal CK in a manner shown in FIG. 5, for example (to be detailed later). Without considering delay, the clock signal CLKP and the clock signal CLKN are inverted from each other, one of which may be basically identical to the clock signal CK. For example, here, the clock signal CLKP is basically identical to the clock signal CK, and the clock signal CLKN is the inverse of the clock signal CLKP (or the clock signal CK).

In contrast to the dynamic latch, the embodiment of the present disclosure adds a feedback stage 207 (here, implemented as a tri-state gate) used for feedback control. When the clock CK is at a low level, the transmission gate 201 is turned on, the tri-state gate 207 is turned off, and the input signal D is transmitted to the output $Q_N$. When the clock becomes a high level, the transmission gate 201 is turned off, and the tri-state gate 207 is turned on, so as to latch the signal at the node A and prevent current leakage from changing the signal level of the node. In this way, the latch according to the embodiments of the present disclosure is not limited by the minimum working frequency.

The following gives a detailed description with reference to FIG. 7. FIG. 7 shows five complete clock cycles T1 to T5, a part of a clock cycle preceding T1, and a part of a clock cycle T6., in which vertical dotted lines show how the clock cycles T1 to T6 correspond to time t1 to t12.

As shown in FIG. 7, at the time t1, the clock signal CK changes from logic high to logic low. Accordingly, the clock signal CLKP changes from high to low, and the clock signal CLKN changes from low to high. In a time period from the time t1 to the time t2, the input D is high, the clock signal CLKP is low, CLKN is high, the transmission gate 201 is turned on, and the node A is high. In this way, the output (that is, the output $Q_N$) of the inverter 205 is low.

In the time period from the time t1 to the time t2, the output $Q_N$ is low, the clock signal CLKP is low, and the clock signal CLKN is high. Therefore, the transistors 525 and 523 are cut off, and the tri-state gate 207 is in a high-impedance state, so that the node A is maintained at a high potential by the input D.

At the time t2 in the first cycle T1 of the clock CK, the clock signal CK toggles to high, the clock signal CLKP toggles to high, and the clock signal CLKN toggles to low. Therefore, in a time period from the time t2 to the time t3, the transmission gate 201 is turned off. Moreover, because the clock signals CLKP and CLKN are high and low respectively, the transistor 523 and the transistor 525 in the tri-state gate 207 are turned on. At this time, the output $Q_N$ is low, thereby holding (latching) the signal high at the node A.

Subsequently, in a time period from the time t3 to the time t4, D is held high, so the circumstance is similar to that of the time period from t1 to t2, and the output $Q_N$ is held low. The node A is held high.

Before the time t5, the input signal D changes from high to low. However, in a time period from the time t4 to the time t5, similar to the time period from the time t2 to the time t3, the signal at the node A is latched (held at the high potential) so that the output $Q_N$ is held low without changing with the change of the input D.

At the time t5, the clock signal CK changes from logic high to logic low again; accordingly, the clock signal CLKP changes from high to low, and the clock signal CLKN changes from low to high. At this time, the input D is low. Therefore, in a time period from the time t5 to the time t6, the input D is low, CLKP is low, and the clock signal CLKN is high. Therefore, the transmission gate 201 is turned on; the input D is low, and therefore, the node A is low. In this way, the output (that is, the output $Q_N$) of the inverter 205 is high.

In the time period from the time t5 to the time t6, the clock signal CLKP is low, the clock signal CLKN is high, and the output $Q_N$ is high. Therefore, the transistors 523 and 525 in the feedback stage 207 are turned off, and the node A is held low by the input D.

Subsequently, at the time t6, the clock signal CK toggles to high, the clock signal CLKP toggles to high, and the CLKN toggles to low. Therefore, in a time period from the time t6 to the time t7, the transmission gate 201 is turned off. Moreover, because the clock signals CLKP and CLKN are high and low respectively and the output $Q_N$ is high, the transistor 525 and the transistor 523 in the tri-state gate 207 are turned on, such that the tri-state gate 207 is turned on and the signal at the node A is held (latched) low. Therefore, the output $Q_N$ is held high.

Subsequently, at the time t7, the clock signal CK changes from logic high to logic low again; accordingly, the clock signal CLKP changes from high to low, and the clock signal CLKN changes from low to high. At this time, the input D is still low. Therefore, the circumstance of a time period from the time t7 to the time t8 is similar to the circumstance of the time period from the time t5 to the time t6, details of which are omitted here.

Before the time t9, the input D changes from low to high. Because the feedback stage 207 is turned on and the signal at the node A is held low, the output $Q_N$ is held high. The output $Q_N$ does not change with the change of the input D.

The circumstance from the time t9 to the time t12 is similar to the circumstance from the time t1 to the time t4, details of which are omitted here.

According to embodiments of the present disclosure, a stage of feedback (the feedback stage 207) is added, thereby providing a semi-static latch. The semi-static latch according to the embodiments of the present disclosure can stably maintain the potential of the floating node (such as the node A), and reduce power consumption of the semi-static latch. The semi-static latch according to the embodiments of the present disclosure is not limited by the minimum working frequency of the dynamic latch, and the working speed of the latch may be configured to be between a working speed of a dynamic latch and a working speed of a static latch, thereby eliminating the limitation of the minimum working frequency and achieving an optimized trade-off between speed and power consumption.

In addition, in the semi-static latch according to the embodiments of the present disclosure, because the potential of the floating node can be maintained, the use of high-threshold devices (such as high-threshold transistors) is avoided. In this way, transistors in the semi-static latch can be configured to have basically identical thresholds. Here, person skilled in the art would understand that, although the transistor devices in the semi-static latch are designed to have basically identical thresholds, variations in the manufacturing process may lead to some deviations of the thresholds of the devices that are practically manufactured. Generally, in this specification, thresholds are regarded as basically identical when the variations between the thresholds fall within ±20%, or ±15%, or ±10%, or ±5% of the designed or target threshold, for example.

However, the present disclosure is not limited to this. In some embodiments, in order to shorten a clock-to-output delay, the input stage 201 may use a low-threshold device to increase the speed of the latch, and the feedback stage 207 may use a high-threshold device to reduce the power consumption and the current leakage.

In addition, the number of transistors used in the semi-static latch according to the embodiments of the present disclosure is minimized. In a calculation-intensive processor (for example, a processor for digital currency), a large number of latches may exist. Therefore, even reduction of one transistor in the latch is still meaningful to reduction of the area and power consumption of the chip.

In addition, the semi-static latch according to the embodiments of the present disclosure can effectively maintain the potential of the floating node, so malfunction is avoided even when the latch works at a relatively low frequency. The semi-static latch according to the embodiments of the present disclosure can also work at a relatively high frequency, thereby providing flexibility for design of a processor and reducing power consumption.

It should also be understood that, although the above examples are described by using embodiments where a high level is active, other embodiments of the present disclosure can also be implemented in a manner where a low level is active. In this case, waveforms of the clock signals CLKN and CLKP will be inverted.

Figure 2B:
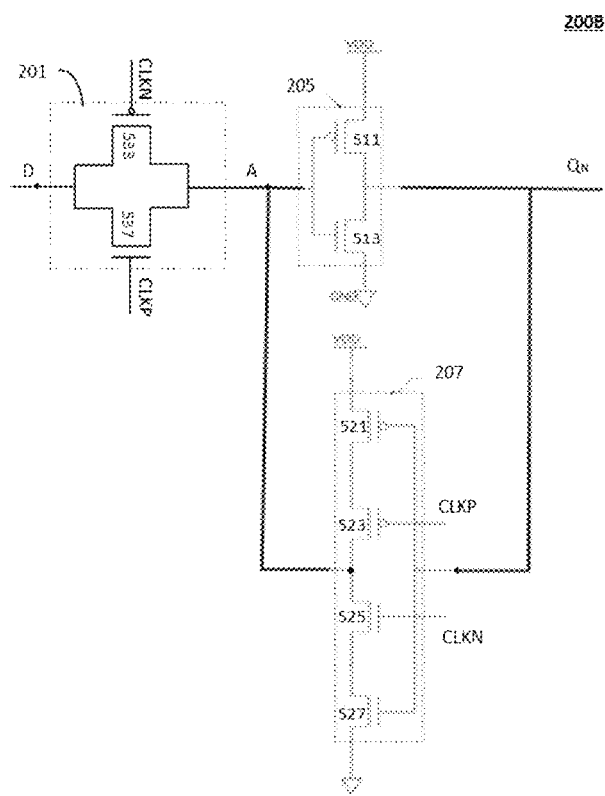
FIG. 2B shows a circuit diagram of a latch according to some embodiments of the present disclosure.

FIG. 2B shows a circuit diagram of a latch according to some embodiments of the present disclosure. The latch 200B in the embodiment shown in FIG. 2B differs from the latch 200A shown in FIG. 2A only in the clock signal provided to the latch. In the latch 200A shown in FIG. 2A, when the clock CK is low (at this time, the clock signal CLKP is low and the clock signal CLKN is high), the transmission gate of the input stage is turned on to transmit the signal, while the feedback stage is turned off; when the clock CK is high (at this time, the clock signal CLKP is high and the clock signal CLKN is low), the feedback stage is active, thereby latching the signal at the node A. The case is opposite for the latch 200B shown in FIG. 2B.

As shown in FIG. 2B, in the latch 200B: in the input stage 201, the gate of the transistor 533 is connected to the clock signal CLKN, and the gate of the transistor 537 is connected to the clock signal CLKP; in the feedback stage, the gate of the transistor 523 is connected to the clock signal CLKP, and the gate of the transistor 525 is connected to the clock signal CLKN.

Figure 8:
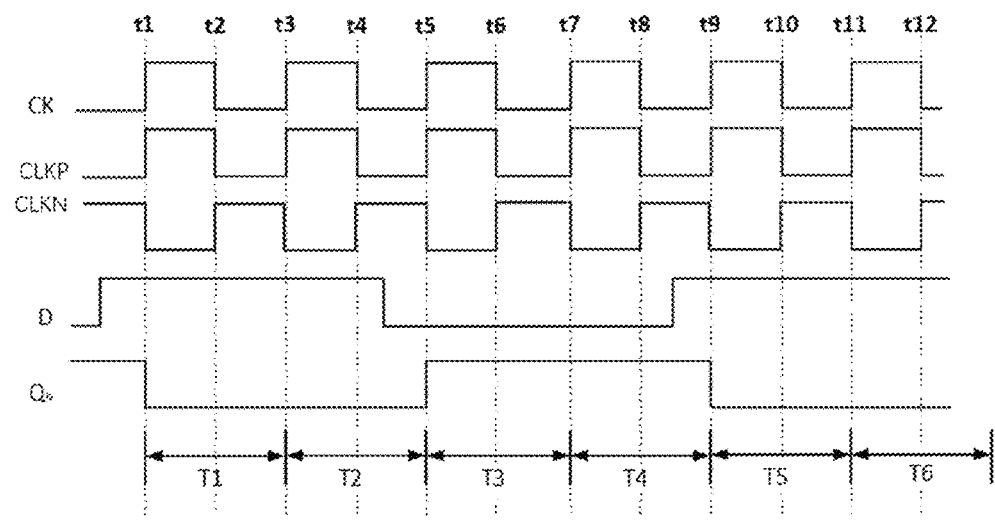
FIG. 8 shows a timing diagram of a schematic signal waveform of a latch according to some other embodiments of the present disclosure.

FIG. 8 shows a timing diagram of a schematic signal waveform for use in the latch 200B. As shown in FIG. 8, in the latch 200B, when the clock CK is high (at this time, the clock signal CLKP is high and the clock signal CLKN is low), the transmission gate of the input stage is turned on to transmit the signal, while the feedback stage is turned off; when the clock CK is low (at this time, the clock signal CLKP is low and the clock signal CLKN is high), the feedback stage is active, thereby latching the signal at the node A.

Other components or configurations of the latch 200B shown in FIG. 2B are the same as those of the latch 200A shown in FIG. 2A, and the description made above with reference to FIG. 2A is equally or adaptively applicable to the latch 200B, details of which are thus omitted here.

Figure 3A:
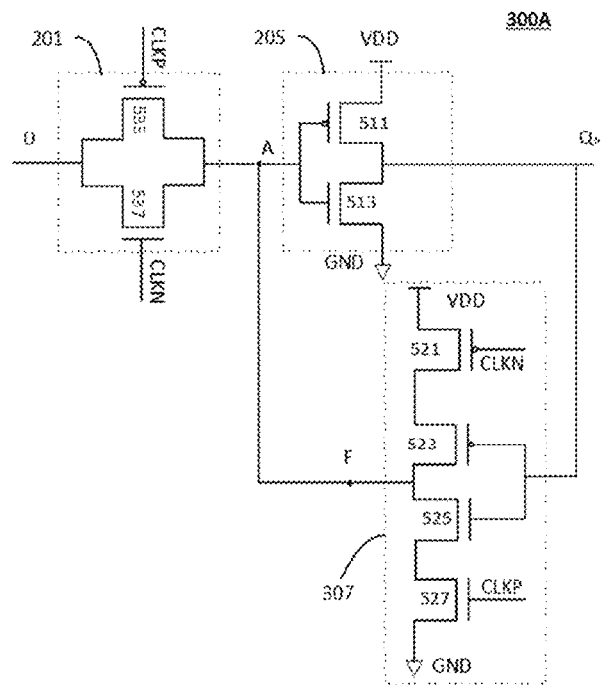
FIG. 3A shows a schematic circuit diagram of a latch according to some other embodiments of the present disclosure.

FIG. 3A shows a schematic circuit diagram of a semi-static latch according to some other embodiments of the present disclosure. The semi-static latch 300A shown in FIG. 3A differs from the latch 200A shown in FIG. 2A only in the feedback stage. The feedback stage 307 in the semi-static latch 300A differs from the feedback stage 207 in FIG. 2A in the transistors that receive the clock signals CLKN and CLKP and the latch output $Q_N$.

In the embodiment shown in FIG. 3A, the gate of the first transistor 521 is connected to the clock signal CLKN, and the gate of the second transistor 523 is connected to the latch output $Q_N$. The gate of the third transistor 525 is connected to the latch output $Q_N$, and the gate of the fourth transistor 527 is connected to the clock signal CLKP.

It's apparent for a person of ordinary skill in the art that the operations and logic level changes described above with respect to FIG. 2A are equally or adaptively applicable here. In addition, remaining components in FIG. 3A are identical to the corresponding components in FIG. 2A, further details of which are thus omitted here. It is hereby noted that, in contrast to the embodiment shown in FIG. 3A, the connection manner of the clock signals in the feedback mode shown in FIG. 2A can achieve a higher working speed.

Figure 3B:
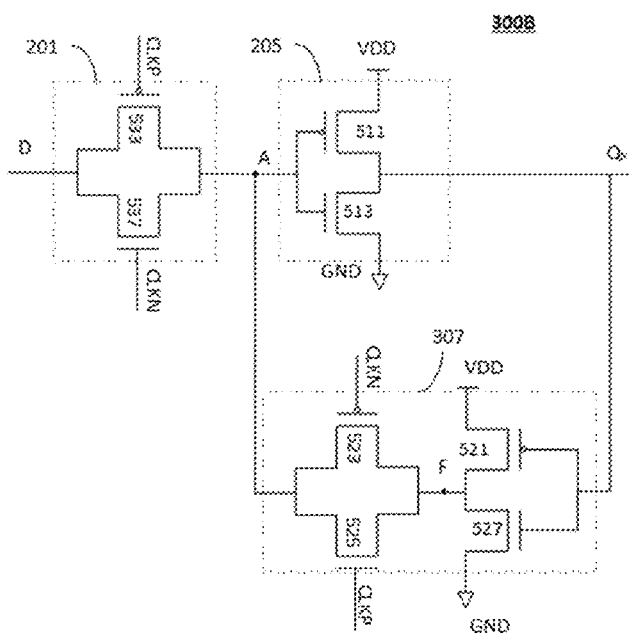
FIG. 3B shows a schematic circuit diagram of a latch according to some other embodiments of the present disclosure.

FIG. 3B shows a schematic circuit diagram of a semi-static latch according to some other embodiments of the present disclosure. The semi-static latch 300B shown in FIG. 3B differs from the semi-static latch 300A shown in FIG. 3A and the latch 200A shown in FIG. 2A only in the feedback stage. In the semi-static latch 300B, the tri-state logic of the feedback stage 307 is implemented as an inverter and a transmission gate connected in series.

As shown in FIG. 3B, the CMOS transistors 521 and 527 constitute an inverter, and CMOS transistors 523 and 525 constitute a transmission gate. The input of the inverter is connected to the latch output node ($Q_N$), and the output of the inverter is connected to the input (node F) of the transmission gate. The output of the transmission gate is connected to the intermediate node (node A). Two control terminals of the transmission gate (that is, gates of the CMOS transistors 523 and 525) receive the clock signal CLKN and the clock signal CLKP respectively.

In the latch 300B, when the clock CK is low (at this time, the clock signal CLKP is low and the clock signal CLKN is high), the transmission gate of the input stage is turned on to transmit the signal, and the feedback stage is turned off; when the clock CK is high (at this time, the clock signal CLKP is high and the clock signal CLKN is low), the transmission gate of the input stage is turned off, and the feedback stage is active, thereby latching the signal at the node A.

In the embodiment shown in FIG. 3B, the node F may be used as an output to output the inverse Q of the latch output $Q_N$.

Figure 3C:
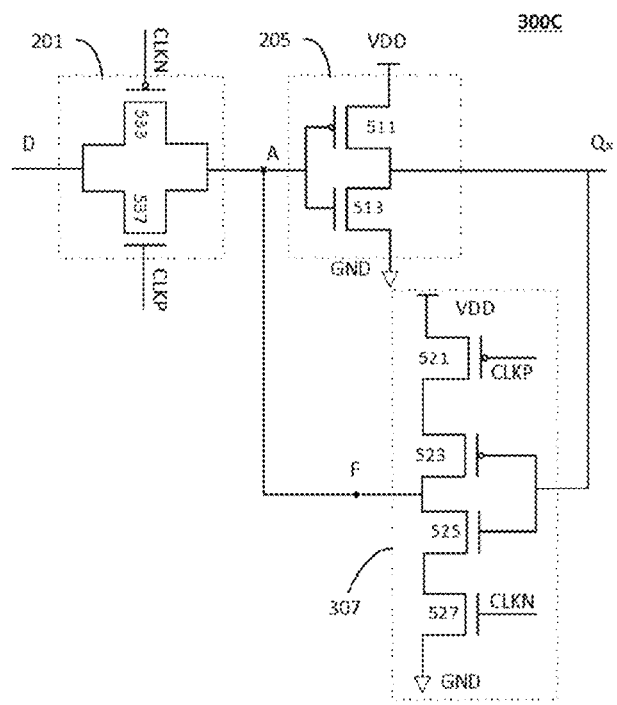
FIG. 3C shows a schematic circuit diagram of a latch according to some other embodiments of the present disclosure.

FIG. 3C shows a schematic circuit diagram of a semi-static latch according to some other embodiments of the present disclosure. The semi-static latch 300C shown in FIG. 3C differs from the semi-static latch 300A shown in FIG. 3A only in the clock signal provided to the latch. In the latch 300C shown in FIG. 3C, when the clock CK is high (at this time, the clock signal CLKP is high and the clock signal CLKN is low), the transmission gate of the input stage is turned on to transmit the signal, and the feedback stage is turned off; when the clock CK is low (at this time, the clock signal CLKP is low and the clock signal CLKN is high), the feedback stage is active, thereby latching the signal at the node A. Other components or configurations of the latch 300C shown in FIG. 3C are the same as those of the latch 300A shown in FIG. 3A, and the description made above with reference to FIG. 2A, FIG. 2B, and FIG. 3A is equally or adaptively applicable to the latch 300C, details of which are thus omitted here.

Figure 3D:
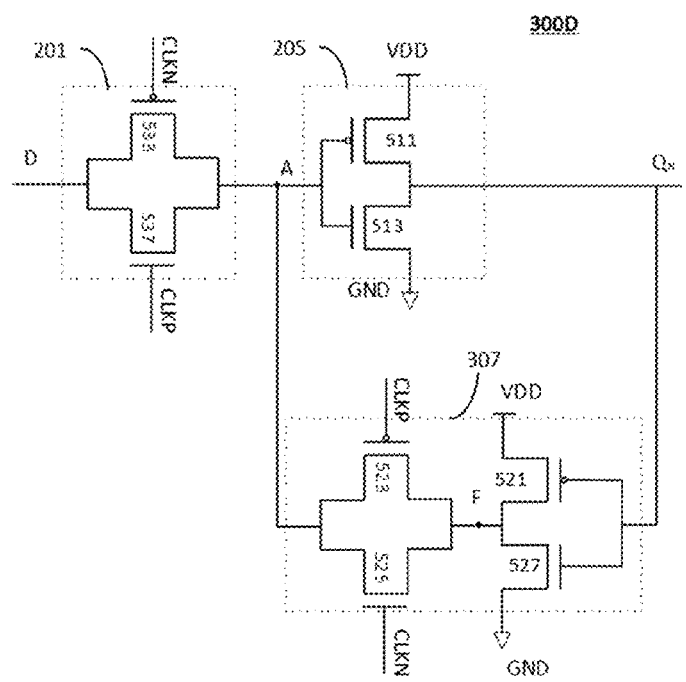
FIG. 3D shows a schematic circuit diagram of a latch according to some other embodiments of the present disclosure.

FIG. 3D shows a schematic circuit diagram of a semi-static latch according to some other embodiments of the present disclosure. The semi-static latch 300D shown in FIG. 3D differs from the semi-static latch 300B shown in FIG. 3B only in the clock signal provided to the latch. In the latch 300D shown in FIG. 3D, when the clock CK is low (at this time, the clock signal CLKP is low and the clock signal CLKN is high), the transmission gate of the input stage is turned off and the feedback stage is active, so as to latch the signal at the node A; when the clock CK is high (at this time, the clock signal CLKP is high and the clock signal CLKN is low), the transmission gate of the input stage is turned on to transmit the signal, and the feedback stage is turned off. Other components or configurations of the latch 300D shown in FIG. 3D are the same as those of the latch 300B shown in FIG. 3B, and the description made above with reference to FIG. 2A, FIG. 2B, FIG. 3A, and FIG. 3B is equally or adaptively applicable to the latch 300D, details of which are thus omitted here.

Figure 4:
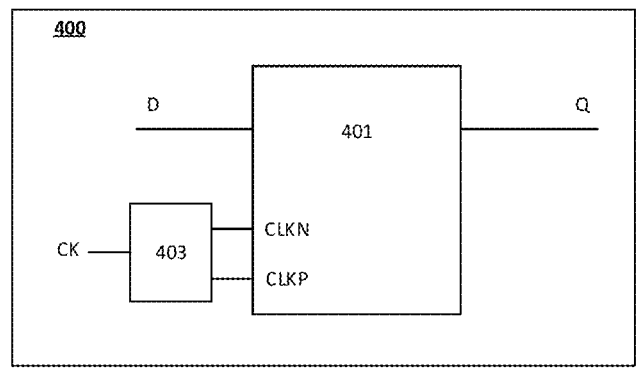
FIG. 4 shows a schematic block diagram of a processor that includes a clock circuit and a latch according to some embodiments of the present disclosure.

According to the present disclosure, a processor is further provided. FIG. 4 shows a schematic block diagram of a processor that includes a clock circuit and a semi-static latch according to some embodiments of the present disclosure. As shown in FIG. 4, a processor 400 includes at least one semi-static latch 401. The semi-static latch may be the semi-static latch according to any one of the embodiments of the present disclosure. The processor 400 may further include a clock circuit 403 configured to provide a desired clock signal to each semi-static latch. As shown in FIG. 4, the clock circuit 403 receives a clock signal CK (which may be a system clock signal, or a clock signal received from outside), and outputs different clock signals CLKN and CLKP. As mentioned above, in some embodiments, the clock signals CLKN and CLKP are opposite in phase.

Figure 5:
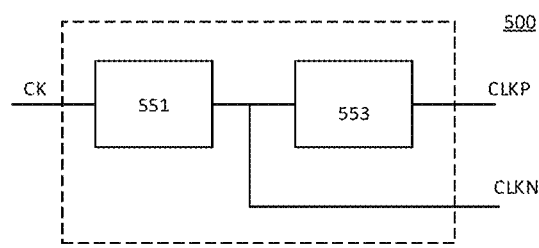
FIG. 5 shows a schematic block diagram of a clock circuit according to some embodiments of the present disclosure.

FIG. 5 shows a schematic block diagram of a clock circuit according to some embodiments of the present disclosure. The clock circuit 500 includes a first inverter 551 and a second inverter 553 connected in series. The first inverter 551 receives a clock signal (for example, a system clock) CK and outputs a first clock signal (for example, the clock signal CLKN or CLKP). The second inverter receives the first clock signal and outputs a second clock signal (for example, the clock signal CLKP or CLKN). In this way, the first clock signal and the second clock signal are inverted from each other. The first clock signal and the second clock signal may be provided to one or more of the plurality of semi-static latches.

Figure 6:
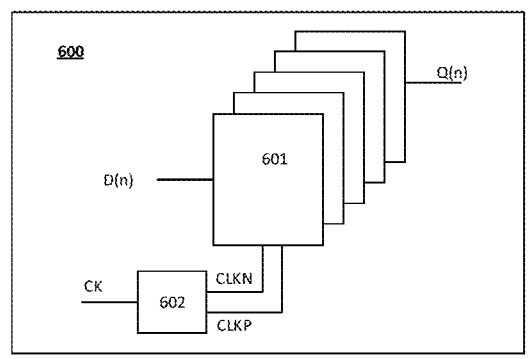
FIG. 6 shows a schematic block diagram of a processor that includes a clock circuit and a plurality of latches according to some embodiments of the present disclosure.

FIG. 6 shows a schematic block diagram of a processor that includes a clock circuit and a plurality of semi-static latches according to some embodiments of the present disclosure. As shown in FIG. 6, a processor 600 includes a plurality of semi-static latches 601 and a clock circuit 602 that provides a clock signal to the plurality of semi-static latches 601. The clock circuit 602 receives a clock CK and outputs clock signals CLKN and CLKP to each of the semi-static latchs 601. The clock circuit 602 may be, for example, the clock circuit shown in FIG. 4.

According to the present disclosure, a computing apparatus is further provided, which may include the processor according to any one of the embodiments of the present disclosure. In some embodiments, the computing apparatus may be a computing apparatus for digital currency. The digital currency may be, for example, digital RMB, Bitcoin, Ethereum, Litecoin, or the like.

A person skilled in the art should appreciate that the boundaries between the operations (or steps) described in the above embodiments are merely illustrative. A plurality of operations may be combined into a single operation, and a single operation may be distributed among additional operations, and the operations may be performed in time periods that at least partly overlap. Moreover, alternative embodiments may include a plurality of instances of particular operations, and the order of operations may be changed in other various embodiments. However, other modifications, changes, and substitutions are also possible. Therefore, this specification and the drawings appended hereto are intended as illustrative rather than restrictive.

Although the present disclosure has been described in detail with regard to some specific embodiments by using examples, a person skilled in the art shall understand that the examples are merely intended to be illustrative rather than restrict the scope of the present disclosure. The embodiments disclosed herein may be combined arbitrarily without departing from the spirit and scope of the present disclosure. A person skilled in the art shall also understand that various modifications may be made to the embodiments without departing from the spirit and scope of the present disclosure. The scope of the present disclosure is defined by the claims appended hereto.

The invention claimed is:

1. A latch with an inverted output, comprising:
an input stage configured to receive a latch input;
an output stage configured to output a latch output;
an intermediate node disposed between an output of the input stage and an input of the output stage, wherein a potential at the intermediate node is floating during a part of time of operation, and wherein the output stage is configured to receive a signal at the intermediate node as an input; and
a feedback stage configured to receive the latch output and provide a feedback to the intermediate node,
wherein the feedback stage assumes a logic-high state, a logic-low state, and a high-impedance state,
wherein the latch output is inverted from the latch input,
wherein in the latch, the potential at the intermediate node is capable of being maintained, the latch is configured to not use a high-threshold transistor as a transistor as a transistor connected to the intermediate node, and the latch is configured such that a threshold of the transistor connected to the intermediate node in the latch is substantially the same as those of other transistors in the latch, and
wherein the latch is configured to work at a first frequency in an operation state, and work at a second frequency lower than the first frequency in a sleep or idle state without malfunction, the second frequency is configured such that a dynamic latch obtained by removing the feedback stage from the latch incurs malfunction at the second frequency.

2. The latch according to claim 1, wherein the feedback stage comprises a tri-state gate that comprises:
first to fourth transistors that are sequentially connected in series, wherein the first transistor and the second transistor are transistors of a first conductivity type, the third transistor and the fourth transistor are transistors of a second conductivity type that is different from the first conductivity type,
a control terminal of one of the first transistor and the second transistor is configured to be connected to the latch output, and a control terminal of the other of the first transistor and the second transistor is configured to be connected to a first clock signal,
a control terminal of one of the third transistor and the fourth transistor is configured to be connected to the latch output, and a control terminal of the other of the third transistor and the fourth transistor is configured to be connected to a second clock signal, wherein the second clock signal is an inverse of the first clock signal,
a node at which the second transistor and the third transistor are connected with each other is configured to be connected to the intermediate node.

3. The latch according to claim 2, wherein:
the first conductivity type is P-type, and the second conductivity type is N-type,
when the first clock signal is high and the second clock signal is low, the feedback stage is configured to be turned off to assume a high-impedance state;
when the first clock signal is low and the second clock signal is high, the feedback stage is configured to provide a feedback to the intermediate node based on the latch output.

4. The latch according to claim 3, wherein the input stage is a transmission gate, one end of which is configured to receive the latch input, and another end of which is configured to be connected to the intermediate node,
the transmission gate comprises a fifth transistor of the first conductivity type and a sixth transistor of the second conductivity type that are connected in parallel,
a gate of the fifth transistor is configured to receive the second clock signal, and a gate of the sixth transistor is configured to receive the first clock signal.

5. The latch according to claim 2, wherein the input stage is a transmission gate, one end of which is configured to receive the latch input, another end of which is configured to be connected to the intermediate node, and control terminals of which are configured to receive the first clock signal and the second clock signal respectively.

6. The latch according to claim 1, wherein the feedback stage comprises an inverter and a transmission gate connected in series,
the inverter comprises a first transistor of a first conductivity type and a fourth transistor of a second conductivity type that are connected in series, the transmission gate comprises a second transistor of the first conductivity type and a third transistor of the second conductivity type that are connected in parallel, the second conductivity type is different from the first conductivity type,
an input of the inverter is configured to be connected to the latch output, an output of the inverter is configured to be connected to an input of the transmission gate, an output of the transmission gate is configured to be connected to the intermediate node,
two control terminals of the transmission gate are configured to receive a first clock signal and a second clock signal respectively, wherein the second clock signal is an inverse of the first clock signal.

7. The latch according to claim 6, wherein:
the first conductivity type is P-type, and the second conductivity type is N-type,
when the first clock signal is high and the second clock signal is low, the feedback stage is configured to be turned off to assume a high-impedance state;

when the first clock signal is low and the second clock signal is high, the feedback stage is configured to provide a feedback to the intermediate node based on the latch output.

8. The latch according to claim 1, wherein the output stage is an inverter.

9. A processor comprising:
 at least one latch, wherein the latch is the latch according to claim 1.

10. The processor according to claim 9, wherein the at least one latch comprises a plurality of latches; and the processor further comprises:
 a clock circuit configured to provide a desired clock signal to each of the plurality of latches.

11. The processor according to claim 10, wherein the clock circuit comprises a first inverter and a second inverter connected in series, the first inverter is configured to receive a clock signal and output a first clock signal, and the second inverter is configured to receive the first clock signal and output a second clock signal,
 the first clock signal and the second clock signal are provided to each of the plurality of latches.

12. A computing apparatus comprising the processor according to claim 9.

13. The computing apparatus according to claim 12, wherein the computing apparatus is a computing apparatus for digital currency.

* * * * *